US011444585B2

(12) United States Patent
Honda et al.

(10) Patent No.: US 11,444,585 B2
(45) Date of Patent: Sep. 13, 2022

(54) POWER AMPLIFIER

(71) Applicant: Murata Manufacturing Co., Ltd., Kyoto (JP)

(72) Inventors: Yuri Honda, Kyoto (JP); Fumio Harima, Kyoto (JP); Kenji Mukai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 204 days.

(21) Appl. No.: 16/407,498

(22) Filed: May 9, 2019

(65) Prior Publication Data

US 2019/0356281 A1 Nov. 21, 2019

(30) Foreign Application Priority Data

May 15, 2018 (JP) .............................. JP2018-094016

(51) Int. Cl.
| | |
|---|---|
| *H03F 3/191* | (2006.01) |
| *H03F 1/56* | (2006.01) |
| *H03F 3/21* | (2006.01) |
| *H03F 1/26* | (2006.01) |
| *H03F 1/22* | (2006.01) |

(52) U.S. Cl.
CPC ............... *H03F 1/565* (2013.01); *H03F 1/22* (2013.01); *H03F 1/26* (2013.01); *H03F 3/21* (2013.01); *H03F 2200/222* (2013.01); *H03F 2200/318* (2013.01); *H03F 2200/387* (2013.01); *H03F 2200/408* (2013.01); *H03F 2200/451* (2013.01)

(58) Field of Classification Search
CPC .................................. H03F 3/191; H03F 1/22
USPC .................................................. 330/302, 310
See application file for complete search history.

(56) References Cited

U.S. PATENT DOCUMENTS

| | | | | |
|---|---|---|---|---|
| 4,348,643 | A * | 9/1982 | Tennyson ................ | H03F 3/191 330/294 |
| 4,555,677 | A * | 11/1985 | Beesley .................. | H03F 3/343 330/302 |
| 6,806,777 | B2 * | 10/2004 | Franca-Neto ........... | H03F 3/193 330/302 |
| 2015/0130537 | A1 | 5/2015 | Nakamura et al. | |

FOREIGN PATENT DOCUMENTS

| | | |
|---|---|---|
| JP | 2001-156702 A | 6/2001 |
| JP | 2015-095708 A | 5/2015 |

* cited by examiner

*Primary Examiner* — Henry Choe
(74) *Attorney, Agent, or Firm* — Pearne & Gordon LLP (57) ABSTRACT

A power amplifier includes power amplification circuits in a plurality of stages including a first stage and a second stage, each power amplification circuit including a transistor. The power amplification circuit in the first stage includes a first impedance circuit between an emitter of the transistor and a reference potential. The first impedance circuit has an impedance that does not vary with frequency or an impedance that varies with frequency. The power amplification circuit in the second stage includes a second impedance circuit between an emitter of the transistor and a reference potential. The second impedance circuit has an impedance that does not vary with frequency or an impedance that varies with frequency.

13 Claims, 8 Drawing Sheets

| R3 | R7 | GAIN | RxBN | NF | Pout_max | PAE_max |
|---|---|---|---|---|---|---|
| [ohm] | [ohm] | [dB] | [dBm/100kHz] | [dB] | [dBm] | [%] |
| 10 | 0 | 40 | −78.5 | 6.9 | 34.6 | 46 |
| 10 | 2 | 33.5 | −84 | 7.1 | 34.3 | 45 |
| 10 | 4 | 30 | −86.5 | 7.7 | 33.3 | 41 |
| 5 | 0 | 40.5 | −78 | 6.9 | 34.6 | 45 |
| 5 | 2 | 33.8 | −83.7 | 6.6 | 34.3 | 45 |
| 5 | 4 | 30.6 | −86.5 | 7.2 | 33.4 | 41 |
| 2 | 0 | 41 | −77.5 | 7 | − | − |
| 2 | 2 | 34 | −83.5 | 6.3 | 34.4 | 45 |
| 2 | 4 | 30.7 | −86.3 | 7 | 33.5 | 42 |

POWER AMPLIFIER

This application claims priority from Japanese Patent Application No. 2018-094016 filed on May 15, 2018. The content of this application is incorporated herein by reference in its entirety.

BACKGROUND

The present disclosure relates to a power amplifier. In mobile communication devices, examples of which include cellular phone devices and smartphones, power amplifiers are used to amplify radio frequency (RF) signals.

Japanese Unexamined Patent Application Publication No. 2015-95708 describes a power amplification module including transistors connected in a plurality of stages.

GSM (registered trademark) (global system for mobile communications), which is a second-generation communication standard, imposes strict requirements for reduction of receive-band noise (RxBN). Thus, a demand exists for power amplifiers with reduced noise.

BRIEF SUMMARY

Accordingly, the present disclosure reduces noise. According to embodiments of the present disclosure, a power amplifier for amplifying a radio-frequency signal includes power amplification circuits in a plurality of stages including a first stage and a second stage, each power amplification circuit including a transistor. The power amplification circuit in the first stage includes a first impedance circuit between an emitter of the transistor and a reference potential, and the first impedance circuit has an impedance that does not vary with frequency or an impedance that varies with frequency. The power amplification circuit in the second stage includes a second impedance circuit between an emitter of the transistor and a reference potential, and the second impedance circuit has an impedance that does not vary with frequency or an impedance that varies with frequency.

According to embodiments of the present disclosure, noise reduction may be achieved.

Other features, elements, characteristics and advantages of the present disclosure will become more apparent from the following detailed description of embodiments of the present disclosure with reference to the attached drawings.

DETAILED DESCRIPTION

The following describes power amplifiers according to embodiments of the present disclosure in detail with reference to the drawings. The following embodiments are not intended to limit the present disclosure. It is to be understood that the embodiments are illustrative and components shown in different embodiments may be partially replaced or combined with each other. In a second embodiment, descriptions of things that are common to a first embodiment will be omitted and only different points will be described. In particular, similar operations and effects based on similar configurations will not be repeated in every embodiment.

To easily understand the embodiments, a comparative example will be described.

Comparative Example

Figure 1:
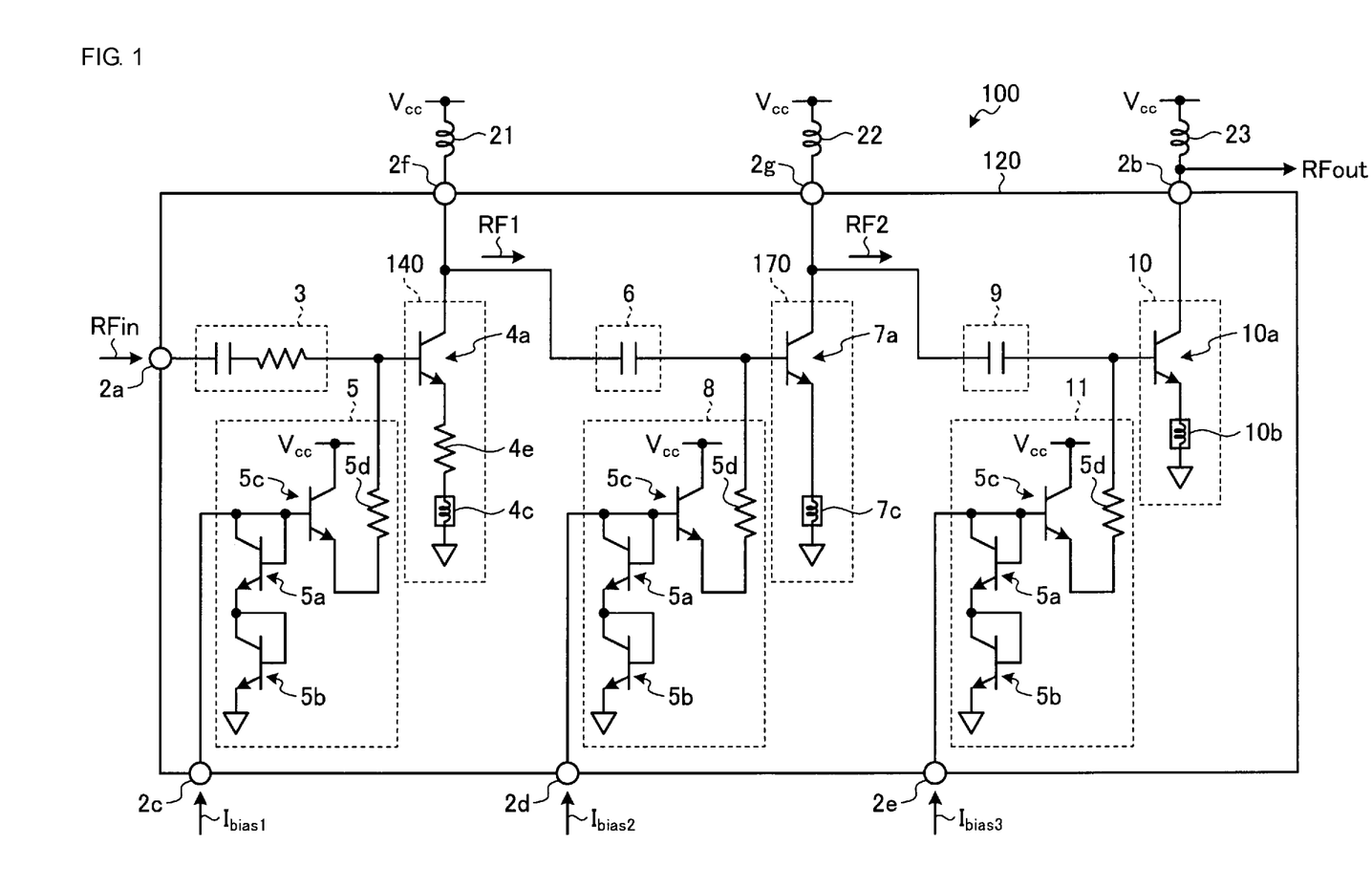
FIG. 1 illustrates the configuration of a power amplifier according to a comparative example.

FIG. 1 illustrates the configuration of a power amplifier according to a comparative example. A power amplifier 100 is included in a mobile communication device, such as a cellular phone device, and is available for transmission and reception of various signals such as audio signals and data signals to and from a base station.

The power amplifier 100 is disposed on an integrated circuit (IC) (semiconductor integrated circuit) chip 120. The power amplifier 100 amplifies a radio-frequency input signal RFin, which is input to a terminal 2a from a circuit in the preceding stage. The power amplifier 100 outputs an amplified radio-frequency output signal RFout to a circuit in the subsequent stage from a terminal 2b. The circuit in the preceding stage is, for example, but not limited to, a transmit power control circuit that adjusts the power of a modulated signal. The circuit in the subsequent stage is, for example, but not limited to, a front-end circuit that performs processing, such as filtering, on the radio-frequency output signal RFout before transmitting the radio-frequency output signal RFout to an antenna.

The frequencies of the radio-frequency input signal RFin and the radio-frequency output signal RFout range from, for example, but not limited to, about hundreds of megahertz (MHz) to about tens of gigahertz (GHz). For instance, the 900 MHz band for GSM (registered trademark) (global system for mobile communications) ranges from about 870 MHz to about 960 MHz, by way of example. The 1.9 GHz band for GSM (registered trademark) ranges from about 1850 MHz to about 1990 MHz, by way of example.

The power amplifier 100 includes a first power amplification circuit 140 in the first stage (initial stage), and a first matching circuit 3 that matches impedance between the circuit in the preceding stage and the first power amplification circuit 140. The first power amplification circuit 140 amplifies the radio-frequency input signal RFin, which has passed through the first matching circuit 3, and outputs an amplified radio-frequency signal RF1. The first power amplification circuit 140 may also be referred to as a driver-stage power amplification circuit. The power amplifier 100 further includes a first bias circuit 5 that sets the first power amplification circuit 140 to an electrically-biased state.

The power amplifier 100 further includes a second power amplification circuit 170 in the second stage (intermediate stage), and a second matching circuit 6 that matches impedance between the first power amplification circuit 140 and the second power amplification circuit 170. The second power amplification circuit 170 amplifies the radio-frequency signal RF1, which has passed through the second matching circuit 6, and outputs an amplified radio-frequency signal RF2. The power amplifier 100 further includes a second bias circuit 8 that sets the second power amplification circuit 170 to an electrically-biased state.

The power amplifier 100 further includes a third power amplification circuit 10 in the third stage (final stage), and a third matching circuit 9 that matches impedance between the second power amplification circuit 170 and the third power amplification circuit 10. The third power amplification circuit 10 amplifies the radio-frequency signal RF2, which has passed through the third matching circuit 9, and outputs the amplified radio-frequency output signal RFout. The third power amplification circuit 10 may also be referred to as a power-stage power amplification circuit. The power amplifier 100 further includes a third bias circuit 11 that sets the third power amplification circuit 10 to an electrically-biased state. The radio-frequency output signal RFout output from the third power amplification circuit 10 is input from the terminal 2b to the circuit in the subsequent stage.

The first power amplification circuit 140, the second power amplification circuit 170, and the third power amplification circuit 10 form a three-stage power amplification circuit. The number of stages of power amplification circuits is not limited to three, and any number of multiple stages of power amplification circuits, such as two stages or four or more stages of power amplification circuits, may be used.

The first power amplification circuit 140 includes a transistor 4a. The transistor 4a is, for example, but not limited to, a heterojunction bipolar transistor (HBT). For instance, the transistor 4a may be a field-effect transistor (FET).

The transistor 4a may be a multi-finger transistor having a plurality of unit transistors (referred to also as fingers) electrically connected in parallel to each other. Each unit transistor is a minimum element of a transistor.

The first power amplification circuit 140 includes a resistor 4e. The transistor 4a has an emitter connected to a reference potential via the resistor 4e and a via 4c. That is, the transistor 4a is a common-emitter circuit. The reference potential is, for example, but not limited to, a ground potential.

The transistor 4a has a collector connected to a power supply potential $V_{cc}$ via a terminal 2f and a choke inductor 21. The choke inductor 21 provides direct current (DC) power having the power supply potential $V_{cc}$ to the collector of the transistor 4a. A collector current flows to the collector of the transistor 4a from the power supply potential $V_{cc}$ via the choke inductor 21.

The choke inductor 21 is assumed to have sufficiently high impedance for the frequency band of the radio-frequency input signal RFin. That is, the impedance of the choke inductor 21 is assumed to be negligible in consideration of the frequency band of the radio-frequency input signal RFin. Further, the choke inductor 21 suppresses coupling of the radio-frequency input signal RFin to a power supply circuit.

The transistor 4a has a base to which the radio-frequency input signal RFin is input via the first matching circuit 3. While the first matching circuit 3 is an RC series circuit, it is not limited thereto. The first matching circuit 3 may be a capacitor, for example.

The first bias circuit 5 includes transistors 5a and 5b. The transistor 5a has a collector and a base connected to each other and is thus equivalent to a diode. In the following, a configuration in which the collector and base of a transistor are connected to each other is referred to as diode-connected. The transistor 5a has an emitter to which the collector and base of the transistor 5b are connected. The transistor 5b is diode-connected. The emitter of the transistor 5b is connected to the reference potential. The potentials of the collector and base of the transistor 5a correspond to the voltage drop across the collector-emitter path of the transistor 5a and the collector-emitter path of the transistor 5b, that is, correspond to the voltage drop across two diodes.

The first bias circuit 5 further includes a transistor 5c. The transistor 5c has a collector connected to the power supply potential $V_{cc}$. The transistor 5c has a base connected to the collector and base of the transistor 5a. The potential of the base of the transistor 5c corresponds to the voltage drop across the collector-emitter path of the transistor 5a and the collector-emitter path of the transistor 5b, that is, corresponds to the voltage drop across two diodes.

A first bias current $I_{bias1}$ is input to the collector and base of the transistor 5a and to the base of the transistor 5c from a constant current source via a terminal 2c. The terminal 2c may be connected to a constant voltage source instead of the constant current source and may be provided with a constant voltage from the constant voltage source. A configuration capable of changing the constant current or constant voltage may be used.

The first bias circuit 5 further includes a resistor 5d. The transistor 5c has an emitter connected to the base of the transistor 4a via the resistor 5d. That is, the transistor 5c operates as an emitter follower circuit that takes its output from the emitter. Accordingly, the potential of the base of the transistor 4a is kept constant.

The transistor 4a outputs the radio-frequency signal RF1, which is obtained by amplifying the power of the radio-frequency input signal RFin, to the second matching circuit 6 from the collector thereof.

The second power amplification circuit 170 includes a transistor 7a. The transistor 7a is, for example, but not limited to, an HBT. The transistor 7a may be an FET, for example. The transistor 7a may be a multi-finger transistor.

The transistor 7a has an emitter connected to the reference potential via a via 7c. That is, the transistor 7a is a common-emitter circuit.

The transistor 7a has a collector connected to the power supply potential $V_{cc}$ via a terminal 2g and a choke inductor 22. The choke inductor 22 provides DC power having the power supply potential $V_{cc}$ to the collector of the transistor 7a. A collector current flows to the collector of the transistor 7a from the power supply potential $V_{cc}$ via the choke inductor 22.

The choke inductor 22 is assumed to have sufficiently high impedance for the frequency band of the radio-frequency input signal RFin. That is, the impedance of the choke inductor 22 is assumed to be negligible in consideration of the frequency band of the radio-frequency input signal RFin. Further, the choke inductor 22 suppresses coupling of the radio-frequency input signal RFin to a power supply circuit.

The transistor 7a has a base to which the radio-frequency signal RF1 is input via the second matching circuit 6. While the second matching circuit 6 is a capacitor, it is not limited thereto. The second matching circuit 6 may be an RC series circuit, for example.

The second bias circuit 8 has a circuit configuration similar to that of the first bias circuit 5. Thus, the same or substantially the same components are denoted by the same numerals and will not be described herein.

A second bias current $I_{bias2}$ is input to the collector and base of the transistor 5a of the second bias circuit 8 and to the base of the transistor 5c of the second bias circuit 8 from a constant current source via a terminal 2d. The terminal 2d may be connected to a constant voltage source instead of the constant current source and may be provided with a constant voltage from the constant voltage source. A configuration capable of changing the constant current or constant voltage may be used.

The emitter of the transistor 5c of the second bias circuit 8 is connected to the base of the transistor 7a via the resistor 5d. That is, the transistor 5c of the second bias circuit 8 operates as an emitter follower circuit that takes its output from the emitter. Accordingly, the potential of the base of the transistor 7a is kept constant.

The transistor 7a outputs the radio-frequency signal RF2, which is obtained by amplifying the power of the radio-frequency signal RF1, to the third matching circuit 9 from the collector thereof.

The third power amplification circuit 10 includes a transistor 10a. The transistor 10a is, for example, but not limited to, an HBT. The transistor 10a may be an FET, for example. The transistor 10a may be a multi-finger transistor.

The transistor 10a has an emitter connected to the reference potential via a via 10b. That is, the transistor 10a is a common-emitter circuit.

The transistor 10a has a collector connected to the power supply potential $V_{cc}$ via the terminal 2b and a choke inductor 23. The choke inductor 23 provides DC power having the power supply potential $V_{cc}$ to the collector of the transistor 10a. A collector current flows to the collector of the transistor 10a from the power supply potential $V_{cc}$ via the choke inductor 23.

The choke inductor 23 is assumed to have sufficiently high impedance for the frequency band of the radio-frequency input signal RFin. That is, the impedance of the choke inductor 23 is assumed to be negligible in consideration of the frequency band of the radio-frequency input signal RFin. Further, the choke inductor 23 suppresses coupling of the radio-frequency input signal RFin to a power supply circuit.

The transistor 10a has a base to which the radio-frequency signal RF2 is input via the third matching circuit 9. While the third matching circuit 9 is a capacitor, it is not limited thereto. The third matching circuit 9 may be an RC series circuit, for example.

The third bias circuit 11 has a circuit configuration similar to that of the first bias circuit 5. Thus, the same or substantially the same components are denoted by the same numerals and will not be described herein.

A third bias current $I_{bias3}$ is input to the collector and base of the transistor 5a of the third bias circuit 11 and to the base of the transistor 5c of the third bias circuit 11 from a constant current source via a terminal 2e. The terminal 2e may be connected to a constant voltage source instead of the constant current source and may be provided with a constant voltage from the constant voltage source. A configuration capable of changing the constant current or constant voltage may be used.

The emitter of the transistor 5c of the third bias circuit 11 is connected to the base of the transistor 10a via the resistor 5d. That is, the transistor 5c of the third bias circuit 11 operates as an emitter follower circuit that takes its output from the emitter. Accordingly, the potential of the base of the transistor 10a is kept constant.

The transistor 10a outputs the radio-frequency output signal RFout, which is obtained by amplifying the power of the radio-frequency signal RF2, to the circuit in the subsequent stage from the collector thereof via the terminal 2b.

The power amplifier 100 has high receive-band noise (RxBN). The receive-band noise is found to be caused by (1) thermal noise in the resistor 5d of the first bias circuit 5, (2) noise input from the terminal 2c, (3) noise input from the terminal 2a, and so on. In particular, (1) thermal noise in the resistor 5d of the first bias circuit 5 is found to be dominant. In the following, these types of noise are collectively referred to as "source noise".

When the frequency of the radio-frequency input signal RFin is denoted by $f_1$ and the frequency of the source noise is denoted by $f_2$, the frequency of the receive-band noise, which is denoted by $f_3$, is expressed by formula (1).

$$f_3 = f_1 \pm f_2 \quad (1)$$

This is because conversion of the radio-frequency input signal RFin and the source noise occurs at the collector or base of the transistor 4a. That is, receive-band noise having a frequency given by $f_3 = f_1 + f_2$ and receive-band noise having a frequency given by $f_3 = f_1 - f_2$ appear.

In the comparative example, to reduce receive-band noise, the resistor 4e is disposed in the first power amplification circuit 140 between the transistor 4a and the reference potential.

The reasons for this are that, first, the resistor 4e reduces the gain of the first power amplification circuit 140, resulting in a reduction in receive-band noise level.

The second reason is that conversion of the radio-frequency input signal RFin and the source noise occurs not only at the collector of the transistor 4a but also at the base of the transistor 4a. The conversion gain at the base of the transistor 4a depends on variations in base potential. The resistor 4e reduces variations in the base potential of the transistor 4a. Accordingly, the conversion gain at the base of the transistor 4a is reduced, and the receive-band noise is reduced.

However, still further reduction of receive-band noise is demanded.

First Embodiment

Figure 2:
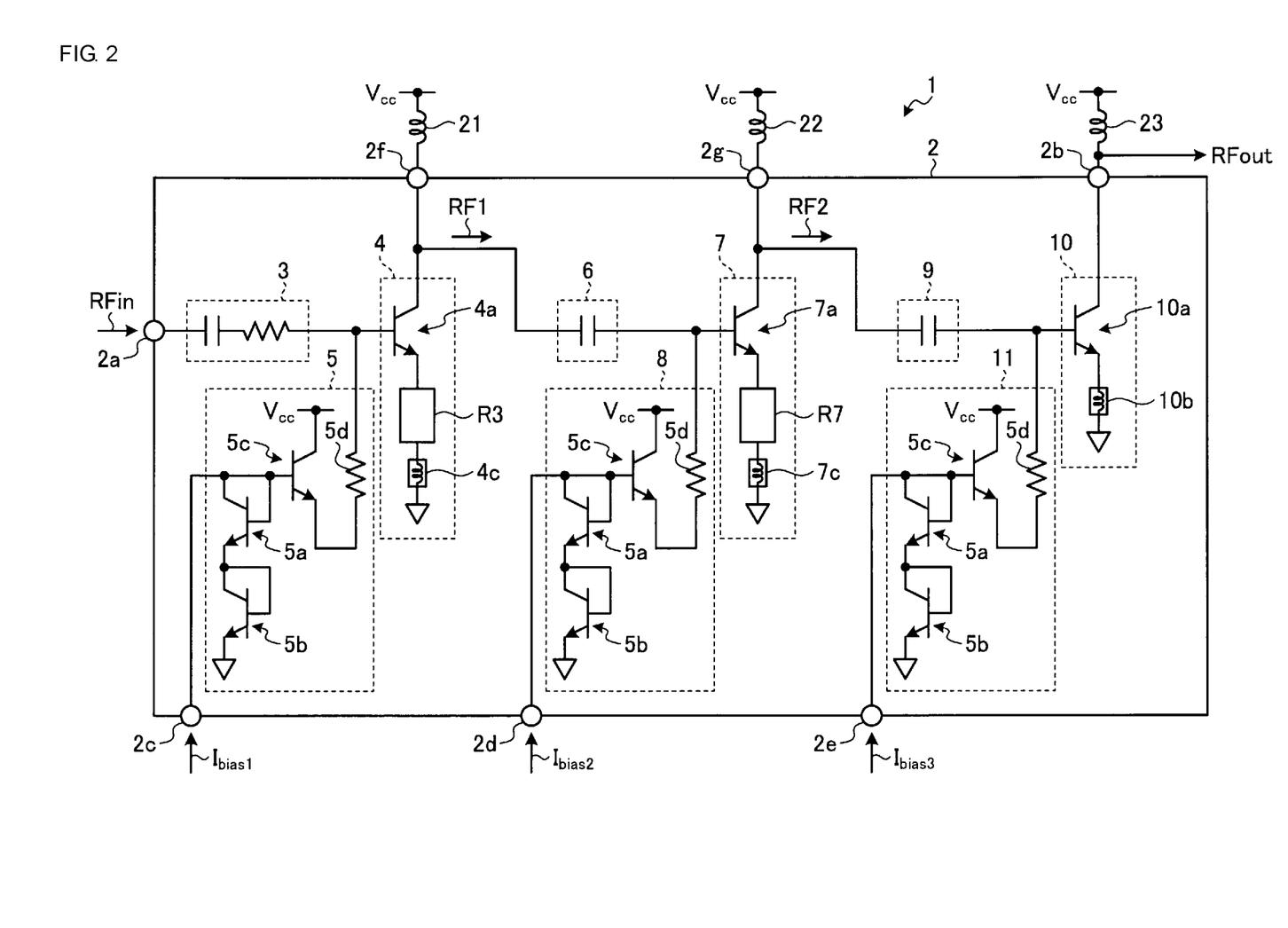
FIG. 2 illustrates the configuration of a power amplifier according to a first embodiment.

FIG. 2 illustrates the configuration of a power amplifier according to a first embodiment. A power amplifier 1 is disposed on an IC chip 2.

The power amplifier 1 includes a first power amplification circuit 4 instead of the first power amplification circuit 140 of the power amplifier 100 according to the comparative example. The power amplifier 1 further includes a second power amplification circuit 7 instead of the second power amplification circuit 170 of the power amplifier 100 according to the comparative example.

The other circuit configuration of the power amplifier 1 is similar to that of the power amplifier 100 according to the comparative example. Thus, in the power amplifier 1, the same or substantially the same components as those of the power amplifier 100 are denoted by the same numerals and will not be described herein.

The first power amplification circuit 4, the second power amplification circuit 7, and the third power amplification circuit 10 form a three-stage power amplification circuit. The number of stages of power amplification circuits is not limited to three, and any number of multiple stages of power amplification circuits, such as two stages or four or more stages of power amplification circuits, may be used.

The first power amplification circuit 4 includes a first impedance circuit R3 instead of the resistor 4e of the first power amplification circuit 140. The first impedance circuit R3 has an impedance that does not vary with frequency or an impedance that varies with frequency.

Figure 3:
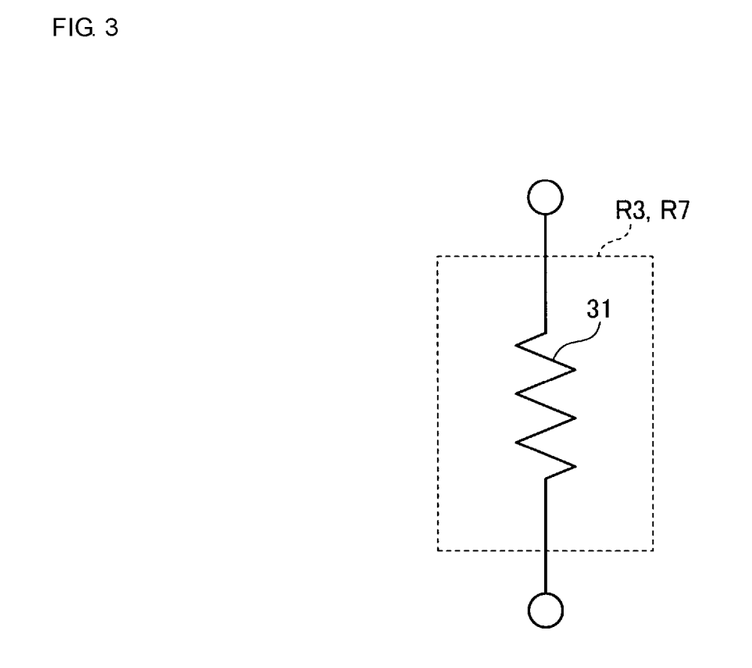
FIG. 3 illustrates an example impedance circuit of the power amplifier according to the first embodiment.

FIG. 3 illustrates an example impedance circuit of the power amplifier according to the first embodiment. The first impedance circuit R3 may be a resistor 31. The resistor 31 has an impedance (resistance value) that does not vary with frequency.

Figure 4:
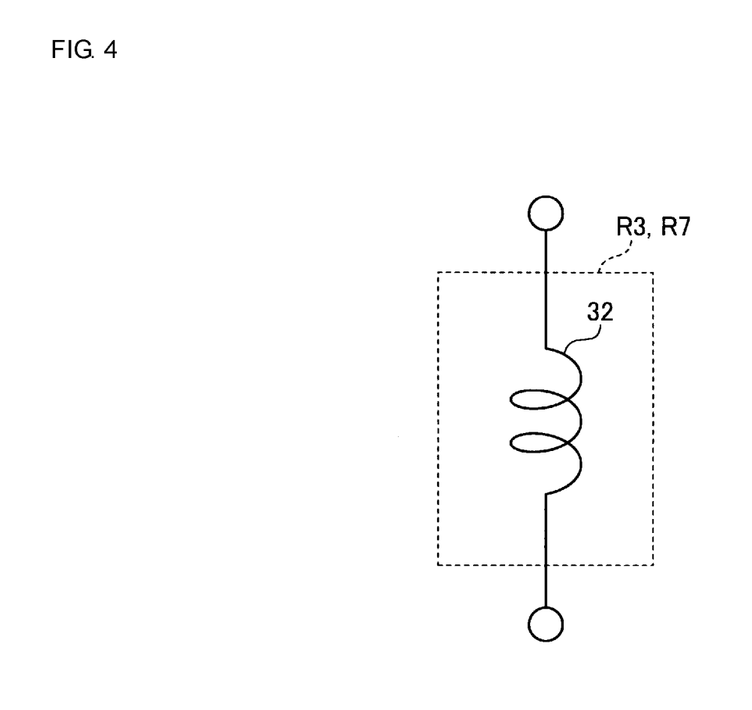
FIG. 4 illustrates another example impedance circuit of the power amplifier according to the first embodiment.

FIG. 4 illustrates another example impedance circuit of the power amplifier according to the first embodiment. The first impedance circuit R3 may be an inductor 32. The inductor 32 has an impedance (inductance) that varies with frequency.

Figure 5:
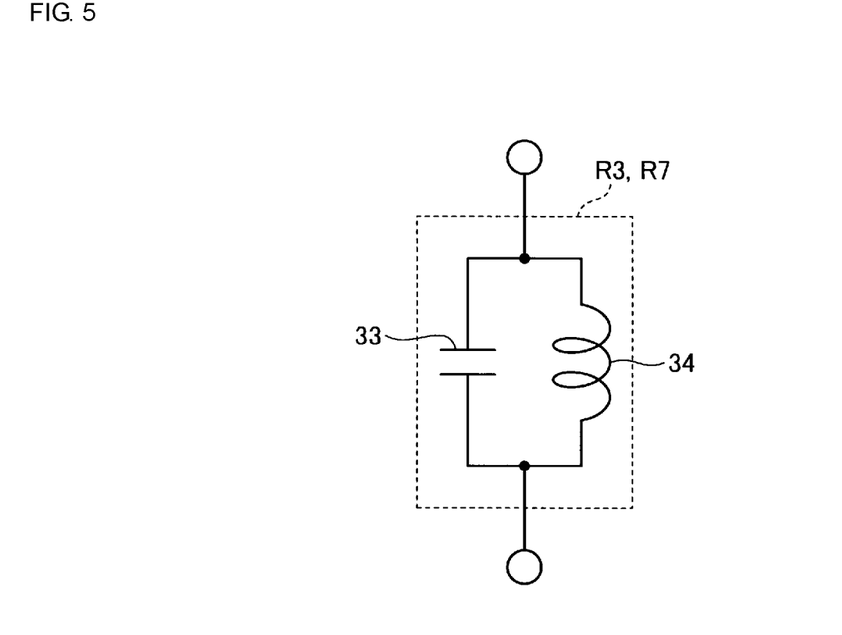
FIG. 5 illustrates still another example impedance circuit of the power amplifier according to the first embodiment.

FIG. 5 illustrates still another example impedance circuit of the power amplifier according to the first embodiment. The first impedance circuit R3 may be a tank circuit (parallel-connected LC circuit) formed of a parallel connection of a capacitor 33 and an inductor 34. The tank circuit has an impedance that varies with frequency.

The first impedance circuit R3 may be a combination of the resistor 31, the inductor 32, or the tank circuit.

Referring back to FIG. 2, the second power amplification circuit 7 further includes a second impedance circuit R7, unlike the second power amplification circuit 170. The second impedance circuit R7 has an impedance that does not vary with frequency or an impedance that varies with frequency.

The second impedance circuit R7 may be the resistor 31 illustrated in FIG. 3. Alternatively, the second impedance circuit R7 may be the inductor 32 illustrated in FIG. 4. Alternatively, the second impedance circuit R7 may be the tank circuit illustrated in FIG. 5.

The second impedance circuit R7 may be a combination of the resistor 31, the inductor 32, or the tank circuit.

The first impedance circuit R3 and the second impedance circuit R7 may be the same or different. That is, when the first impedance circuit R3 is the resistor 31, the second impedance circuit R7 may be the resistor 31, the inductor 32, or the tank circuit. When the first impedance circuit R3 is the inductor 32, the second impedance circuit R7 may be the resistor 31, the inductor 32, or the tank circuit. When the first impedance circuit R3 is the tank circuit, the second impedance circuit R7 may be the resistor 31, the inductor 32, or the tank circuit.

When the first impedance circuit R3 or the second impedance circuit R7 is the tank circuit, the resonant frequency of the tank circuit may match the frequency $f_3$ of the receive-band noise.

The emitter of the transistor 7a is connected to the reference potential via the second impedance circuit R7 and the via 7c. That is, the transistor 7a is a common-emitter circuit.

The effects of the power amplifier 1 according to the first embodiment will be described.

Figure 6:
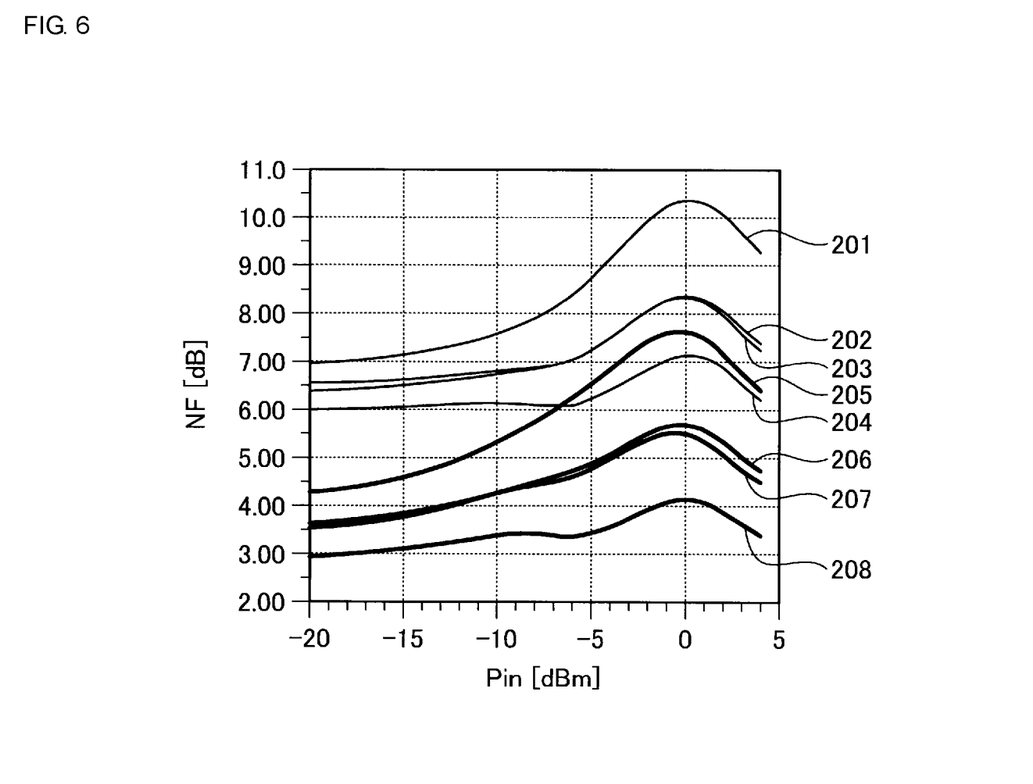
FIG. 6 illustrates circuit simulation results of the power amplifier according to the first embodiment and the power amplifier according to the comparative example.

FIG. 6 illustrates circuit simulation results of the power amplifier according to the first embodiment and the power amplifier according to the comparative example. Specifically, FIG. 6 illustrates the noise figures (NFs) of the power amplifier 1 and the power amplifier 100 when the power Pin of the radio-frequency input signal RFin is changed.

The noise figure NF is expressed by formula (2).

$$NF = RxBN - GAIN - 173.8 \qquad (2)$$

In formula (2), RxBN represents the power level of the receive-band noise, and GAIN represents the gain of the power amplifier 1 and the power amplifier 100. Further, −173.8 is a value given by 10×log (k×T×1000), where k is Boltzmann's constant=1.38×10$^{-23}$ (J/K) and T is absolute temperature (300 Kelvin (K)).

In FIG. 6, the frequency $f_1$ of the radio-frequency input signal RFin is set to 1850 MHz or 1910 MHz, which is a transmit (uplink) frequency of the 1.9 GHz band for GSM (registered trademark), and the frequency $f_2$ of the source noise is set to 20 MHz.

In FIG. 6, lines 201 to 204 indicate the noise figures of the power amplifier 100 according to the comparative example, and lines 205 to 208 indicate the noise figures of the power amplifier 1 according to the first embodiment.

The line 201 indicates the noise figure of the power amplifier 100 according to the comparative example, which is detected at 1930 MHz, when the frequency $f_1$ of the radio-frequency input signal RFin is 1910 MHz.

The line 202 indicates the noise figure of the power amplifier 100 according to the comparative example, which is detected at 1990 MHz, when the frequency $f_1$ of the radio-frequency input signal RFin is 1910 MHz.

The line 203 indicates the noise figure of the power amplifier 100 according to the comparative example, which is detected at 1930 MHz, when the frequency $f_1$ of the radio-frequency input signal RFin is 1850 MHz.

The line 204 indicates the noise figure of the power amplifier 100 according to the comparative example, which is detected at 1990 MHz, when the frequency $f_1$ of the radio-frequency input signal RFin is 1850 MHz.

The line 205 indicates the noise figure of the power amplifier 1 according to the first embodiment, which is detected at 1930 MHz, when the frequency $f_1$ of the radio-frequency input signal RFin is 1910 MHz.

The line 206 indicates the noise figure of the power amplifier 1 according to the first embodiment, which is detected at 1990 MHz, when the frequency $f_1$ of the radio-frequency input signal RFin is 1910 MHz.

The line 207 indicates the noise figure of the power amplifier 1 according to the first embodiment, which is detected at 1930 MHz, when the frequency $f_1$ of the radio-frequency input signal RFin is 1850 MHz.

The line 208 indicates the noise figure of the power amplifier 1 according to the first embodiment, which is detected at 1990 MHz, when the frequency $f_1$ of the radio-frequency input signal RFin is 1850 MHz.

As illustrated in FIG. 6, the power amplifier 1 according to the first embodiment can have lower noise figure than the power amplifier 100 according to the comparative example under the same frequency condition. The reason for this is as follows.

The present inventors have found that the conversion gain response with respect to the output power (or input power) of the power amplifier 1 depends on the load impedance of the transistor 4a in the first power amplification circuit 4. Then, the present inventors have found that the more stable the load impedance of the transistor 4a in the first power amplification circuit 4, that is, the smaller the variations in the load impedance of the transistor 4a, the less the conversion gain becomes. Accordingly, the present inventors have studied stabilization of the load impedance of the transistor 4a in the first power amplification circuit 4.

The present inventors have found that the base-emitter voltage of the transistor 7a in the second power amplification circuit 7 varies with the output power (or input power) of the power amplifier 1. That is, the present inventors have found that variations in the load impedance of the transistor 4a in the first power amplification circuit 4 are caused by variations in the base-emitter voltage of the transistor 7a in the second power amplification circuit 7. Accordingly, the present inventors have studied reduction in variations in the base-emitter voltage of the transistor 7a in the second power amplification circuit 7 to reduce variations in the load impedance of the transistor 4a in the first power amplification circuit 4.

The present inventors have decided to arrange the second impedance circuit R7 between the emitter of the transistor 7a and the reference potential to reduce variations in the base-emitter voltage of the transistor 7a in the second power amplification circuit 7.

The second impedance circuit R7 disposed between the emitter of the transistor 7a and the reference potential can stabilize the base-emitter voltage of the transistor 7a in the second power amplification circuit 7. The stabilization of the base-emitter voltage of the transistor 7a in the second power amplification circuit 7 can stabilize the load impedance of the transistor 4a in the first power amplification circuit 4. The stabilization of the load impedance of the transistor 4a in the first power amplification circuit 4 can reduce conversion gain at the first power amplification circuit 4. The reduction in conversion gain at the first power amplification circuit 4 can reduce the noise figure. Accordingly, the power amplifier 1 according to the first embodiment can reduce receive-band noise.

Figure 7:
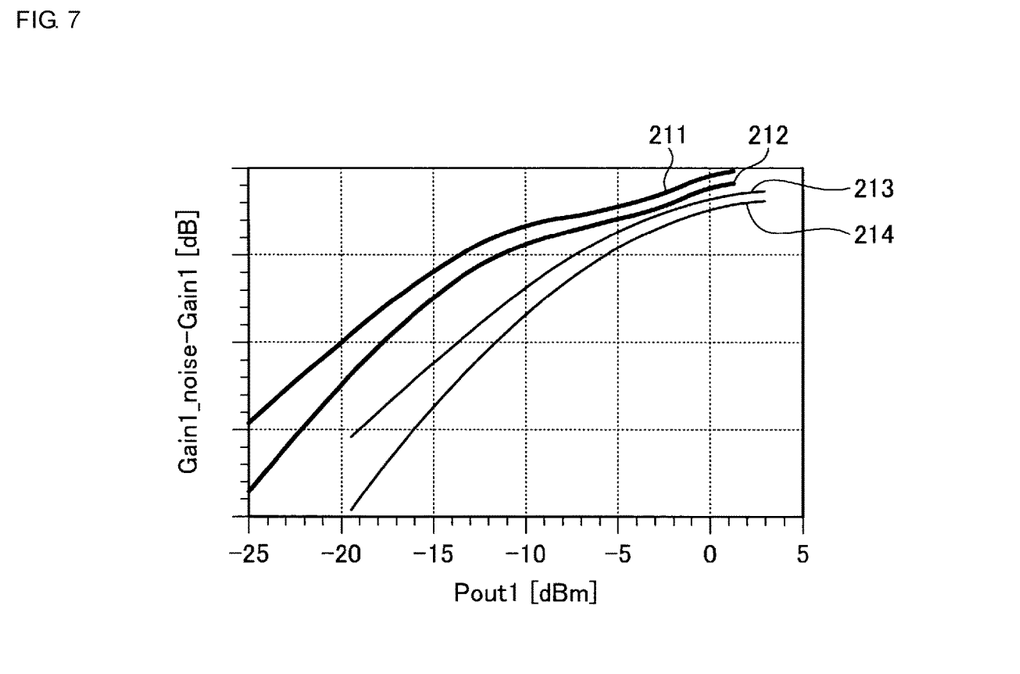
FIG. 7 illustrates circuit simulation results of the power amplifier according to the first embodiment and the power amplifier according to the comparative example.

FIG. 7 illustrates circuit simulation results of the power amplifier according to the first embodiment and the power amplifier according to the comparative example. Specifically, FIG. 7 illustrates noise indices of the first power amplification circuit 4 and the first power amplification circuit 140 when the power Pout1 of the radio-frequency signal RF1 output from the first power amplification circuit 4 and the first power amplification circuit 140 is changed.

In FIG. 7, the noise index is represented as formula (3).

$$\text{(Noise Index)} = \text{Gain1\_noise} - \text{Gain1} \quad (3)$$

Gain1_noise is expressed by formula (4).

$$\text{Gain1\_noise} = \text{Pout1\_noise} - \text{Pin\_noise} \quad (4)$$

In formula (4), Pout1_noise represents the power level of the noise output from the first power amplification circuit 4 and the first power amplification circuit 140, and Pin_noise represents the power level of the noise input to the first power amplification circuit 4 and the first power amplification circuit 140.

Gain1 is expressed by formula (5).

$$\text{Gain1} = \text{Pout1} - \text{Pin} \quad (5)$$

In formula (5), Pout1 represents the power level of the radio-frequency signal RF1 output from the first power amplification circuit 4 and the first power amplification circuit 140, and Pin represents the power level of the radio-frequency input signal RFin input to the first power amplification circuit 4 and the first power amplification circuit 140.

In FIG. 7, the frequency $f_1$ of the radio-frequency input signal RFin is set to 915 MHz, which is a transmit (uplink) frequency of the 900 MHz band for GSM (registered trademark), and the frequency $f_2$ of the source noise is set to 20 MHz.

In FIG. 7, lines 211 and 212 indicate the noise indices of the power amplifier 100 according to the comparative example, and lines 213 and 214 indicate the noise indices of the power amplifier 1 according to the first embodiment.

The line 211 indicates the noise index of the power amplifier 100 according to the comparative example, which is detected at 935 MHz.

The line 212 indicates the noise index of the power amplifier 100 according to the comparative example, which is detected at 895 MHz.

The line 213 indicates the noise index of the power amplifier 1 according to the first embodiment, which is detected at 935 MHz.

The line 214 indicates the noise index of the power amplifier 1 according to the first embodiment, which is detected at 895 MHz.

As illustrated in FIG. 7, the power amplifier 1 according to the first embodiment can have lower noise index than the power amplifier 100 according to the comparative example under the same frequency condition.

Figure 8:
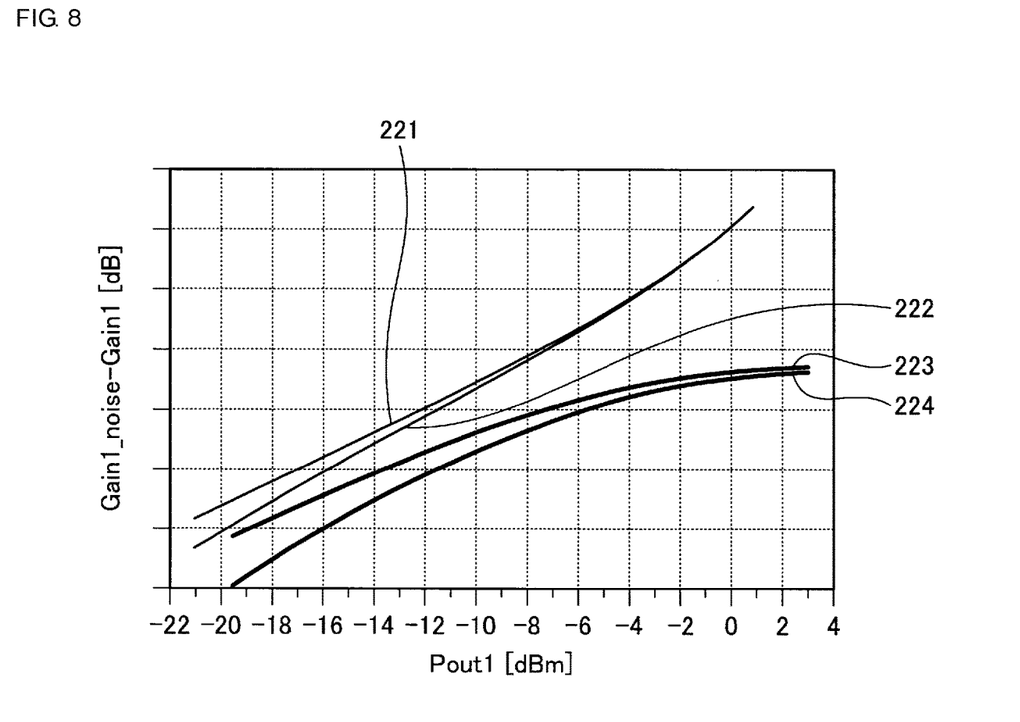
FIG. 8 illustrates circuit simulation results of the power amplifier according to the first embodiment and the power amplifier according to the comparative example.

FIG. 8 illustrates circuit simulation results of the power amplifier according to the first embodiment and the power amplifier according to the comparative example. Specifically, FIG. 8 illustrates noise indices of the first power amplification circuit 4 and the first power amplification circuit 140 when the power Pout1 of the radio-frequency signal RF1 output from the first power amplification circuit 4 and the first power amplification circuit 140 is changed.

In FIG. 8, the noise index is represented as Gain1_noise− Gain1, as described above.

In FIG. 8, the frequency $f_1$ of the radio-frequency input signal RFin is set to 1910 MHz, which is a transmit (uplink) frequency of the 1.9 GHz band for GSM (registered trademark), and the frequency $f_2$ of the source noise is set to 20 MHz.

In FIG. 8, lines 221 and 222 indicate the noise indices of the power amplifier 100 according to the comparative example, and lines 223 and 224 indicate the noise indices of the power amplifier 1 according to the first embodiment.

The line 221 indicates the noise index of the power amplifier 100 according to the comparative example, which is detected at 1930 MHz.

The line 222 indicates the noise index of the power amplifier 100 according to the comparative example, which is detected at 1890 MHz.

The line 223 indicates the noise index of the power amplifier 1 according to the first embodiment, which is detected at 1930 MHz.

The line 224 indicates the noise index of the power amplifier 1 according to the first embodiment, which is detected at 1890 MHz.

As illustrated in FIG. 8, the power amplifier 1 according to the first embodiment can have lower noise index than the power amplifier 100 according to the comparative example under the same frequency condition.

Figure 9:
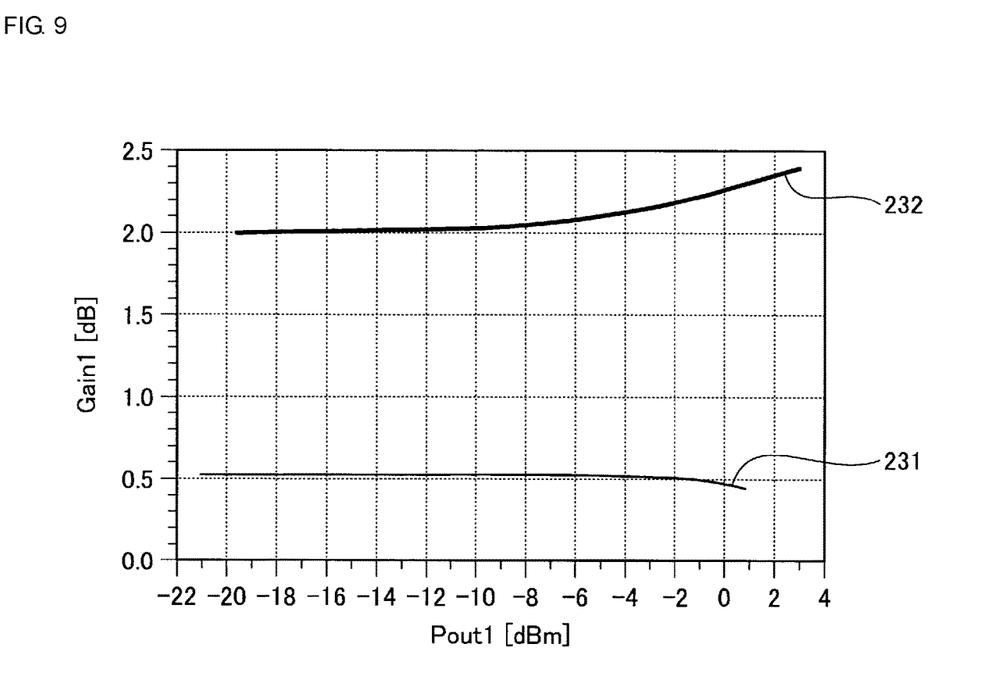
FIG. 9 illustrates circuit simulation results of the power amplifier according to the first embodiment and the power amplifier according to the comparative example.

FIG. 9 illustrates circuit simulation results of the power amplifier according to the first embodiment and the power amplifier according to the comparative example. Specifically, FIG. 9 illustrates the gain of the first power amplification circuit 4 and the gain of the first power amplification circuit 140 when the power Pout1 of the radio-frequency signal RF1 output from the first power amplification circuit 4 and the first power amplification circuit 140 is changed.

In FIG. 9, line 231 indicates the gain of the first power amplification circuit 140 according to the comparative example, and line 232 indicates the gain of the first power amplification circuit 4 according to the first embodiment.

In the first embodiment, the provision of the second impedance circuit R7 is found to result in an increase in the load impedance of the transistor 4a, leading to an increase in the gain of the first power amplification circuit 4.

Figure 10:
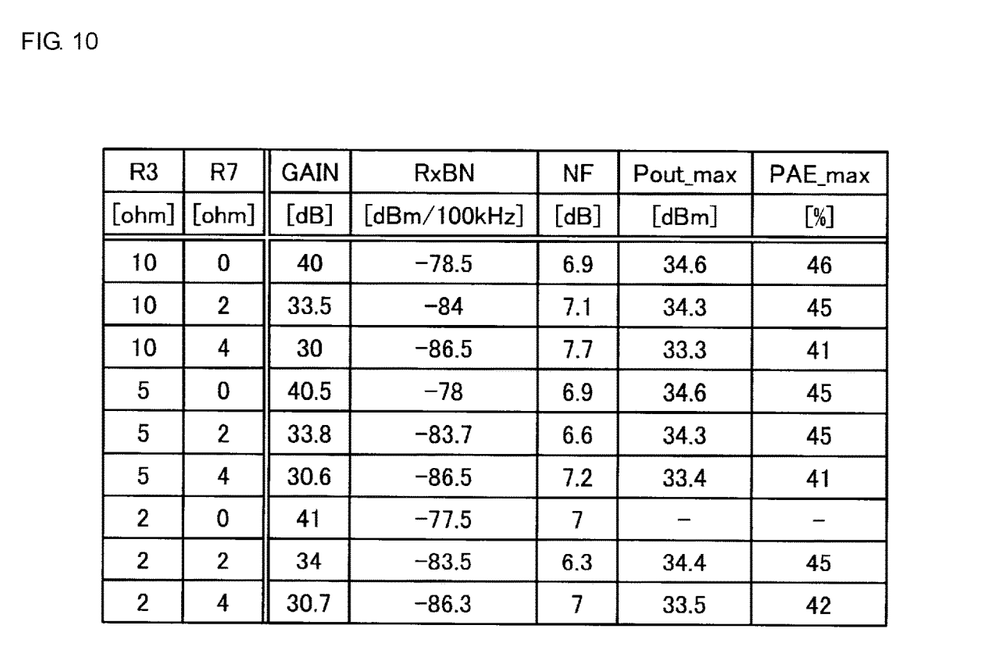
FIG. 10 illustrates circuit simulation results of the power amplifier according to the first embodiment.

FIG. 10 illustrates circuit simulation results of the power amplifier according to the first embodiment. Specifically, FIG. 10 illustrates the gain (dB), the power level RxBN of the receive-band noise (dBm/100 kHz), the noise figure NF (dB), the maximum output power level Pout_max (dBm), and the maximum power-added efficiency PAE_max (%) of the power amplifier 1 for a total of nine combinations of three resistance values of the first impedance circuit R3 and three resistance values of the second impedance circuit R7 when each of the first impedance circuit R3 and the second impedance circuit R7 is constituted by the resistor 31 (see FIG. 3). The three resistance values of the first impedance circuit R3 are 10 ohms (Ω), 5Ω, and 2Ω, and the three resistance values of the second impedance circuit R7 are 0Ω, 2Ω, and 4Ω.

Figure 11:
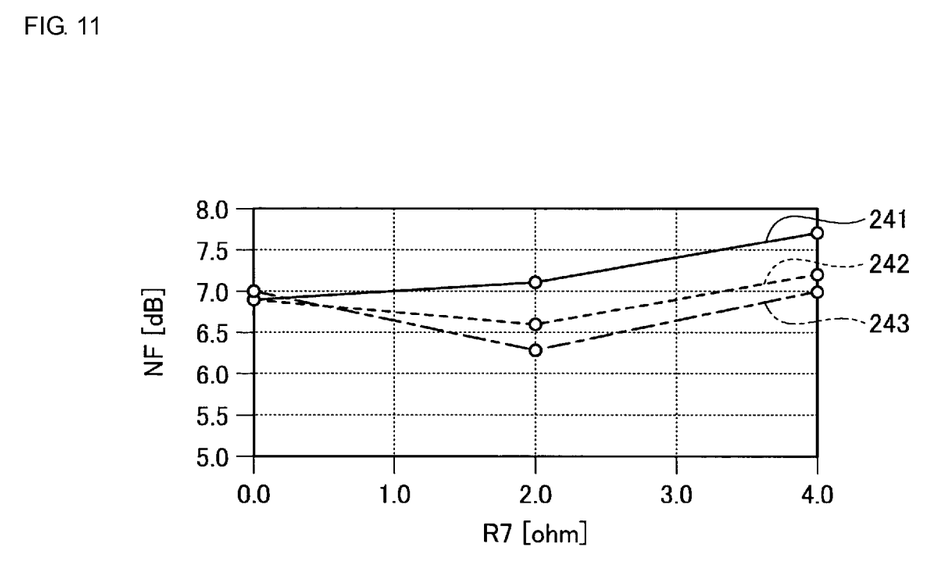
FIG. 11 illustrates circuit simulation results of the power amplifier according to the first embodiment.

FIG. 11 illustrates circuit simulation results of the power amplifier according to the first embodiment. Specifically, FIG. 11 is a graph with the resistance values of the second impedance circuit R7 illustrated in FIG. 10 plotted on the horizontal axis and the noise figures NF illustrated in FIG. 10 plotted on the vertical axis.

In FIG. 11, line 241 indicates the case in which the resistance value of the first impedance circuit R3 is 10Ω, line 242 indicates the case in which the resistance value of the first impedance circuit R3 is 5Ω, and line 243 indicates the case in which the resistance value of the first impedance circuit R3 is 2Ω.

As indicated by the lines 242 and 243, in the case where the resistance value of the first impedance circuit R3 is 5Ω or 2Ω, the value of the noise figure NF is small when the resistance value of the second impedance circuit R7 is 2Ω. Further, as indicated by the line 241, in the case where the resistance value of the first impedance circuit R3 is 10Ω, the value of the noise figure NF is small when the resistance value of the second impedance circuit R7 is 0Ω or 2Ω.

The results of circuit simulation under a variety of conditions indicate that the value of the noise figure NF is small when a relationship of (impedance value of R3)>(impedance value of R7) is established in the frequency range of the radio-frequency input signal RFin. The results further indicate that the value of the noise figure NF is small when a relationship of (impedance value of R3):(impedance value of R7)=about 9:1.5 is established. For example, when the resistance value of the first impedance circuit R3 is 9Ω and the resistance value of the second impedance circuit R7 is 1.5Ω, the value of the noise figure NF is found to be small.

As described above, in the power amplifier 1 according to the first embodiment, the second impedance circuit R7 disposed in the second power amplification circuit 7 between the transistor 7a and the reference potential can reduce noise. Accordingly, the power amplifier 1 can address strict GSM (registered trademark) requirements for reduction of receive-band noise.

Second Embodiment

Figure 12:
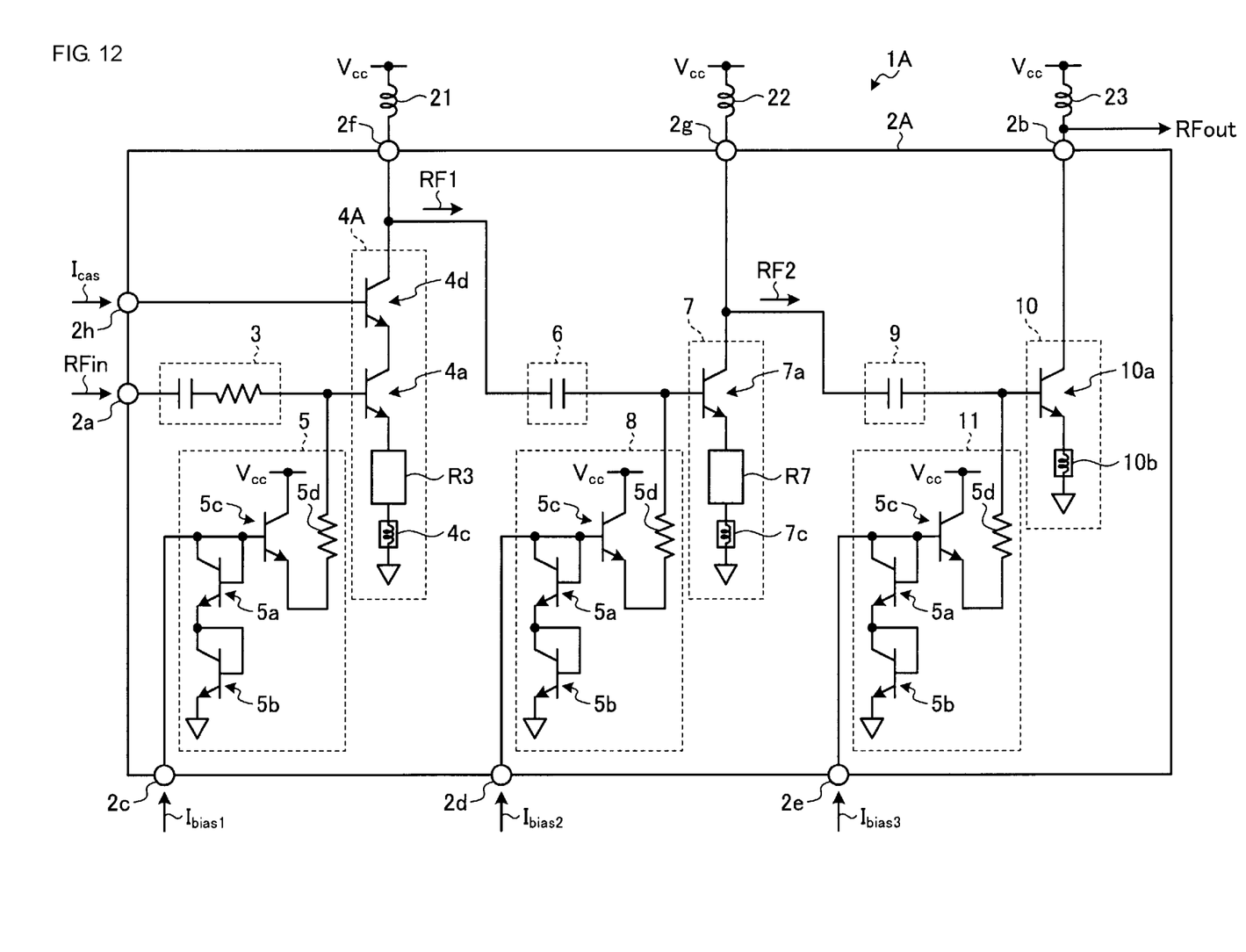
FIG. 12 illustrates the configuration of a power amplifier according to a second embodiment.

FIG. 12 illustrates the configuration of a power amplifier according to a second embodiment. A power amplifier 1A is disposed on an IC chip 2A.

The power amplifier 1A includes a first power amplification circuit 4A instead of the first power amplification circuit 4 of the power amplifier 1 according to the first embodiment.

The other circuit configuration of the power amplifier 1A is similar to that of the power amplifier 1 according to the first embodiment. Thus, in the power amplifier 1A, the same or substantially the same components as those of the power amplifier 1 are denoted by the same numerals and will not be described herein.

The first power amplification circuit 4A, the second power amplification circuit 7, and the third power amplification circuit 10 form a three-stage power amplification circuit. The number of stages of power amplification circuits is not limited to three, and any number of multiple stages of power amplification circuits, such as two stages or four or more stages of power amplification circuits, may be used.

The first power amplification circuit 4A further includes a transistor 4d, unlike the first power amplification circuit 4. The transistor 4d has an emitter connected to the collector of the transistor 4a. The transistor 4d has a collector connected to the power supply potential $V_{cc}$ via the terminal 2f and the choke inductor 21. The transistor 4d has a base to which a fourth bias current $I_{cas}$ is input via a terminal 2h. The base of the transistor 4d is alternating-current (AC) grounded. That is, the transistor 4d is a common-base circuit.

As described above, the emitter of the transistor 4a is connected to the reference potential via the first impedance circuit R3, the collector of the transistor 4a is connected to the emitter of the transistor 4d, and the collector of the transistor 4d is connected to the power supply potential $V_{cc}$ via the choke inductor 21. That is, the transistor 4a and the transistor 4d form a cascode-connected circuit.

The emitter of the transistor 4d is connected to the collector of the transistor 4a, and the transistor 4d is a common-base circuit. Accordingly, the transistor 4d operates in such a manner that the base-emitter voltage thereof is kept constant. The collector voltage of the transistor 4a is thus pulled down to the emitter voltage of the transistor 4d.

In the first power amplification circuit 4A, the collector of the transistor 4a is connected to the emitter of the transistor 4d. With this configuration, the variations in the load impedance seen by the transistor 4a are reduced to some extent by the transistor 4d. However, the load impedance seen by the transistor 4a may vary due to variations in the base potential of the transistor 7a in the second power amplification circuit 7. The second impedance circuit R7 disposed in the second power amplification circuit 7 between the transistor 7a and the reference potential can reduce the variations in the load impedance seen by the transistor 4a. Accordingly, the power amplifier 1A can reduce receive-band noise.

In the power amplifier 1A according to the second embodiment, the second impedance circuit R7 disposed in the second power amplification circuit 7 between the transistor 7a and the reference potential can reduce noise. Accordingly, the power amplifier 1A can address strict GSM (registered trademark) requirements for reduction of receive-band noise.

The embodiments described above are intended to help easily understand the present disclosure and are not to be used to construe the present disclosure in a limiting fashion. The present disclosure may be modified or improved without departing from the spirit thereof, and the present disclosure encompasses equivalents thereof.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier for amplifying a radio-frequency signal, comprising:
a first stage power amplification circuit comprising:
a first transistor, and
a third transistor cascode connected to the first transistor,
a first impedance circuit between an emitter of the first transistor and a reference potential; and
a second stage power amplification circuit comprising:
a second transistor, and
a second impedance circuit between an emitter of the second transistor and the reference potential,
wherein the first stage power amplification circuit precedes the second stage power amplification circuit, and an impedance of the first impedance circuit is greater than an impedance of the second impedance circuit within a frequency range of the radio-frequency signal.

2. The power amplifier according to claim 1, wherein the first impedance circuit or the second impedance circuit comprises a resistor, an inductor, or a tank circuit.

3. The power amplifier according to claim 1, wherein the impedance of the first impedance circuit and the impedance of the second impedance circuit have a ratio of 9:1.

4. The power amplifier according to claim 1, wherein an impedance of the first impedance circuit or an impedance of the second impedance circuit does not vary with frequency.

5. The power amplifier according to claim 2, wherein an impedance of the first impedance circuit or an impedance of the second impedance circuit does not vary with frequency.

6. The power amplifier according to claim 3, wherein an impedance of the first impedance circuit or an impedance of the second impedance circuit does not vary with frequency.

7. The power amplifier according to claim 1, wherein an impedance of the first impedance circuit or an impedance of the second impedance circuit varies with frequency.

8. The power amplifier according to claim 2, wherein an impedance of the first impedance circuit or an impedance of the second impedance circuit varies with frequency.

9. The power amplifier according to claim 3, wherein an impedance of the first impedance circuit or an impedance of the second impedance circuit varies with frequency.

10. The power amplifier according to claim 1, wherein the emitter of the first transistor is connected to the reference potential via the first impedance circuit and a first via, and the emitter of the second transistor is connected to the second potential via the second impedance circuit and a second via.

11. The power amplifier according to claim 2, wherein the emitter of the first transistor is connected to the reference potential via the first impedance circuit and a first via, and the emitter of the second transistor is connected to the second potential via the second impedance circuit and a second via.

12. The power amplifier according to claim 3, wherein the emitter of the first transistor is connected to the reference potential via the first impedance circuit and a first via, and the emitter of the second transistor is connected to the second potential via the second impedance circuit and a second via.

13. The power amplifier according to claim 1, further comprising a final stage power amplification circuit, the final stage power amplification circuit comprising a fourth transistor having an emitter connected to the reference potential without an impedance circuit disposed between the emitter of the fourth transistor and the reference potential.

* * * * *